(12) United States Patent
Lee

(10) Patent No.: US 6,835,590 B2
(45) Date of Patent: Dec. 28, 2004

(54) METHOD OF MANUFACTURING IMAGE SENSOR FOR REDUCING DARK CURRENT

(75) Inventor: Ju-Il Lee, Kyoungki-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 194 days.

(21) Appl. No.: 10/218,931

(22) Filed: Aug. 14, 2002

(65) Prior Publication Data

US 2003/0096442 A1 May 22, 2003

(30) Foreign Application Priority Data

Nov. 16, 2001 (KR) ........................................ 2001-71447

(51) Int. Cl.[7] .............................................. H01L 21/00
(52) U.S. Cl. ........................... 438/69; 438/73; 438/237
(58) Field of Search ............................. 438/57–98, 237; 257/233

(56) References Cited

U.S. PATENT DOCUMENTS

| | | | | |
|---|---|---|---|---|
| 5,336,533 A | * | 8/1994 | Balmashnov et al. | ....... 427/562 |
| 5,462,898 A | * | 10/1995 | Chen et al. | ................. 438/788 |
| 6,071,832 A | * | 6/2000 | Ishikawa | .................... 438/787 |
| 6,140,157 A | * | 10/2000 | Warren et al. | .............. 438/149 |
| 6,483,172 B1 | * | 11/2002 | Cote et al. | ................... 257/639 |
| 2001/0023086 A1 | * | 9/2001 | Park et al. | ..................... 438/57 |
| 2003/0096438 A1 | * | 5/2003 | Lee | .............................. 438/29 |
| 2003/0157769 A1 | * | 8/2003 | Weimer | ...................... 438/261 |

OTHER PUBLICATIONS

Shou–Gwo Wuu et al., "High Performance 0.25–um CMOS Color Imager Technology with Non–silicide Source/Drain Pixel," International Electron Devices Meeting, IEDM Tech. Dig., 705–708 (2000).

* cited by examiner

*Primary Examiner*—Savitri Mulpuri
(74) *Attorney, Agent, or Firm*—Marshall, Gerstein & Borun LLP

(57) ABSTRACT

The disclosed method provides a method capable of removing dangling bonds generated on a surface of photodiode. The method includes steps of: forming a photodiode in a semiconductor substrate; forming a transfer transistor, a reset transistor, a drive transistor and a select transistor on the semiconductor substrate; forming a first interlayer insulating layer on the semiconductor substrate, wherein the first interlayer insulating layer contains hydrogen ions; forming a second interlayer insulating layer on the first interlayer insulating layer; and flattening the second interlayer insulating layer by flowing and simultaneously diffusing the hydrogen ions into a surface of the photodiode.

16 Claims, 7 Drawing Sheets

METHOD OF MANUFACTURING IMAGE SENSOR FOR REDUCING DARK CURRENT

BACKGROUND OF THE DISCLOSURE

1. Field of the Disclosure

The disclosed method relates to a method for manufacturing a semiconductor device; and, more particularly, to a method for manufacturing a complementary metal oxide semiconductor (CMOS) image sensor.

2. Description of the Prior Art

Generally, in a charge couple device (CCD) or a complementary metal oxide semiconductor (CMOS) image sensor, a photodiode (PD), namely a light sensing area, changes an incident light in accordance with each wavelength into an electric signal. An ideal case is that quantum efficiency is one for all wavelengths of light, that is, all the incident light gathered in the photodiode is converted into electric signal.

FIG. 1 is an equivalent circuit diagram of a general CMOS image sensor unit pixel. Referring to FIG. 1, the equivalent circuit includes one photodiode (PD) and four n-channel metal oxide semiconductor (NMOS) transistors (Tx, Rx, Dx, and Sx). The four NMOS transistors are comprised of a transfer transistor (Tx), a reset transistor (Rx), a drive transistor (Dx) and a select transistor (Sx). Outside of the unit pixel (UP), a load transistor (Vb) capable of reading an output signal is formed. A floating diffusion node (FD) (also referred to as a floating sensing node), where an electric charge is transferred from a photodiode (PD), is formed in a same common node.

FIG. 2 is a cross-sectional view showing a conventional unit pixel of a CMOS image sensor shown in FIG. 1.

Referring to FIG. 2, a conventional method for manufacturing a CMOS image sensor will be described.

First, a p-epitaxial layer 12 is grown on a p$^+$-substrate 11. Herein, the p$^+$-substrate 11 is doped with a high concentration of p-type dopant and the p-epitaxial layer 12 is doped with a low concentration of p-type dopant. After growing the p-epitaxial layer 12, a field oxide layer 13, for separating unit pixels, is formed in a predetermined region of the p-epitaxial layer 12 by using a local oxidation of silicon (LOCOS) method.

Thereafter, a p-well 14 is formed in a predetermined region of the p-epitaxial layer 12 with a lateral diffusion caused by a thermal treatment. On the p-well 14, gates of a drive transistor (Dx) and a select transistor (Sx) are formed.

Thereafter, gate electrodes 15a and 15b of the drive transistor (Dx) and the select transistor (Sx), are formed on the p-well 14, and gate electrodes 15c and 15d of the transfer transistor (Tx) and the reset transistor (Rx) are formed on the p-epitaxial layer 12. At this time, the four gate electrodes 15a, 15b, 15c and 15d are formed of a polycide comprising a polysilicon layer and a tungsten silicide layer.

Subsequently, a low concentration of n-type dopant (n$^-$) is injected into the p-epitaxial layer 12 around one side of the gate electrode 15c of the transfer transistor (Tx) with high energy in order to form a n$^-$-diffusion layer 16.

Thereafter, an ion injection process is carried out to form lightly doped drains (LDD) 17 of the drive transistor (Dx) and the select transistor (Sx). Then, after depositing an insulating layer on the substrate, the insulating layer is etched without an etch mask to form a spacer 18 on each side of the four gate electrodes 15a, 15b, 15c and 15d.

Then, p-type dopants (p°) are injected without an ion implantation mask, to form a p°-diffusion region 19 at the surface of the p-epitaxial layer 12. At this time, the p°-diffusion layer 19 contacted to the n$^-$-diffusion layer 16 is apart from the gate of the transfer transistor (Tx) as much as the width of the spacer 18.

A shallow PN connection composed of the p°-diffusion layer 19/the n$^-$-diffusion layer 16 and a PNP-type photodiode composed of the p-epitaxial layer 12/the n$^-$-diffusion layer 16/the p°-diffusion layer 19 are formed by the above-mentioned processes.

Subsequently, an ion injection process for forming source/drain region 20 and 20a is carried out. That is, a floating sensing node 20a, which is a common node of the reset transistor (Rx) and the transfer transistor (Tx), and the source/drains 20 of the drive transistor (Dx), the selective transistor (Sx) and the reset transistor, (Rx) are formed. The drive transistor (Dx) and the select transistor are general MOS transistors, and the select transistor (Sx) and the transfer transistor (Tx) are native NMOS transistors.

Subsequently, a tetraethyl orthosilicate (TEOS) layer 21a and a borophosphosilicate glass (BPSG) layer 21b are formed in order to form a pre-metal dielectric (PMD) layer, and the BPSG layer 21b is flowed and flattened by a thermal treatment performed in an ambient atmosphere of $N_2$. After forming the PMD layer, a metal contact hole (not shown) and a first metal wiring (M1, 22) are formed, then an inter-metal-dielectric (IMD) layer 23 is formed on the first metal wiring 22.

Thereafter, a second metal wiring (M2, 24) is formed on the IMD layer 23, and a protection layer 25 is formed on the substrate including the second metal wiring 22 to complete a general process for forming a CMOS logic region. At this time, an oxide layer is usually used as the protection layer 25, and the first metal wiring 22 and the second metal wiring 24 are not overlapped with the photodiode for the transmission of incident light toward the photodiode (PD).

After completing formation processes of the above-mentioned CMOS logic region, three color filters 26 are formed to realize a color image, and an over coating layer 27 is formed for flattening a resulting structure formed on the substrate 11, then a microlens 28 is formed to increase light concentration.

However, in the above-mentioned conventional method for forming the CMOS logic region, dangling bonds (DB) are generated on a surface of the p°-diffusion layer 19 within a photodiode region, because a plurality of etching processes are carried out to form the field insulation layer by the LOCOS process, to form the gate electrodes and to form the ion implantation mask.

In a boundary of the p°-diffusion layer 19 formed of silicon and the PMD layer formed of oxide layer, a stable condition is maintained when one silicon atom is combined with two oxygen atoms. However, as shown in FIG. 3, owing to a lot of etching processes, the combination of the p°-diffusion layer 19 occurs so that dangling bonds of (—Si—O) or (—Si—) are generated.

Therefore, electrons (e) are generated due to the dangling bonds DB at the surface of the p°-diffusion layer 19 and stored in the n$^-$-diffusion layer 16, whereby a dark current (D) flows from a photodiode (PD) to a floating sensing node (FD) 20, even though light is not incident. In other words, in the case of a light incidence, electrons are generated and stored in a depletion layer (n$^-$-diffusion layer) of a photodiode, and then the electrons are moved to flow a current. However, the dangling bonds (—Si—O or —Si—) on the surface of the p°-diffusion layer 19 are in a condition of easily generating electric charges even though light is not incident. Accordingly, if a plurality of the dangling bonds DB exists, an image sensor shows an irregular reaction when light is incident, and even in a dark situation.

Moreover, in the conventional method, as shown in FIG. 2, the protection layer 25 is formed only with an oxide layer, therefore, it is impossible to remove the dangling bonds and to suppress the excessive generation of the dark current. Accordingly, a picture quality of an image sensor is deteriorated by the dark current flows to the floating sensing node (FD).

SUMMARY OF THE DISCLOSURE

The disclosed method provides a method of manufacturing an image sensor capable of preventing picture quality deterioration, which is caused by a dark current.

In accordance with one aspect of the disclosed method, there is provided a method of manufacturing an image sensor, comprising the steps of: forming a photodiode in a semiconductor substrate; forming a transfer transistor, a reset transistor, a drive transistor and a select transistor on the semiconductor substrate; forming a first interlayer insulating layer on the semiconductor substrate, wherein the first interlayer insulating layer contains hydrogen ions; forming a second interlayer insulating layer on the first interlayer insulating layer; and flattening the second interlayer insulating layer by flowing and simultaneously diffusing the hydrogen ions into a surface of the photodiode.

In accordance with another aspect of the disclosed method, there is provided a method of manufacturing an image sensor, comprising the steps of: forming a photodiode in a semiconductor substrate; forming a transfer transistor, a reset transistor, a drive transistor and a select transistor on the semiconductor substrate; forming a siliconoxynitride layer on the semiconductor substrate, wherein the siliconoxynitride layer contains hydrogen ions; forming a borophosphosilicate glass (BPSG) layer on the siliconoxynitride layer; and flattening the BPSG layer by flowing and simultaneously diffusing the hydrogen ions into a surface of the photodiode.

In accordance with still another aspect of the disclosed method, there is provided a method of manufacturing an image sensor, comprising the steps of: forming a photodiode in a semiconductor substrate; forming a transfer transistor, a reset transistor, a drive transistor and a select transistor on the semiconductor substrate; forming a silicon nitride layer on the semiconductor substrate, wherein the silicon nitride layer contains hydrogen ions; forming a borophosphosilicate glass (BPSG) layer on the silicon nitride layer; and flattening the BPSG layer by flowing and simultaneously diffusing the hydrogen ions into a surface of the photodiode.

In accordance with still another aspect of the disclosed method, there is provided a method of forming an interlayer insulating layer between wirings of an image sensor, comprising the steps of: forming a first interlayer insulating layer on a semiconductor substrate having a photodiode therein, wherein the first interlayer insulating layer contains hydrogen ions; forming a second interlayer insulating layer on the first interlayer insulating layer; and flattening the second interlayer insulating layer and diffusing the hydrogen ions into a surface of the photodiode by performing a thermal treatment.

BRIEF DESCRIPTION OF THE DRAWINGS

Other aspects of the disclosed method will become apparent from the following description of the disclosed method with reference to the accompanying drawings, in which.

DETAILED DESCRIPTION OF THE DISCLOSURE

Hereinafter, a method for manufacturing an image sensor for reducing a dark current according to the disclosed method will be described in detail referring to the accompanying drawings.

Figure 1:
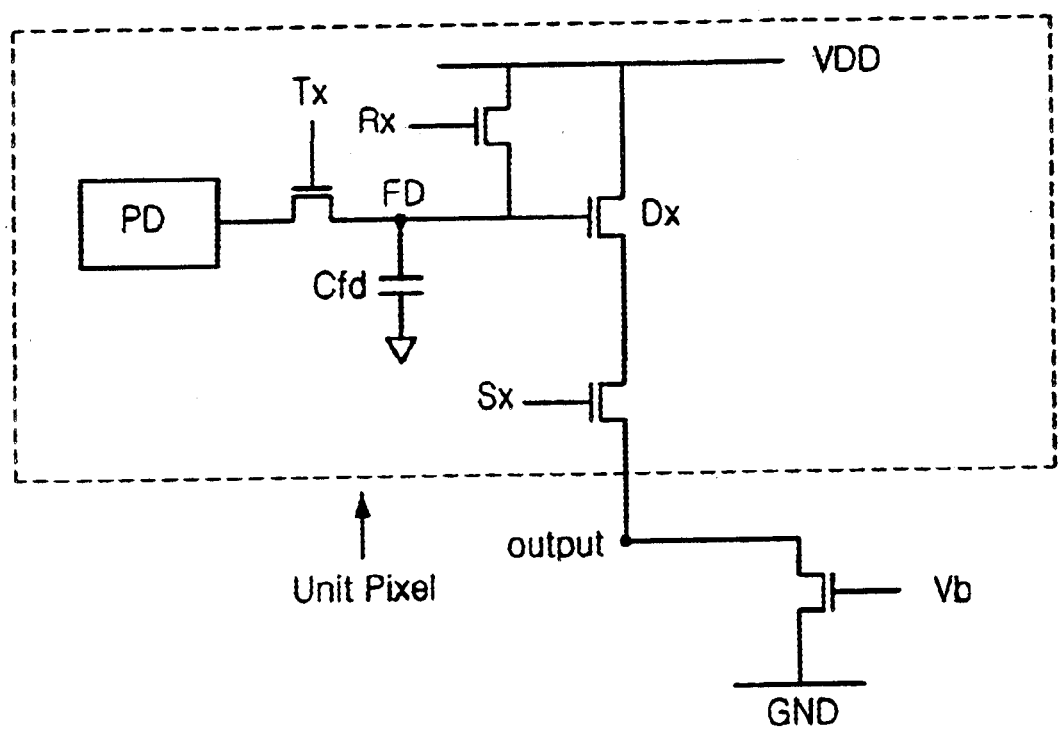
FIG. 1 is an equivalent circuit diagram illustrating a general unit pixel of a complementary metal oxide semiconductor (CMOS) image sensor.
Figure 2:
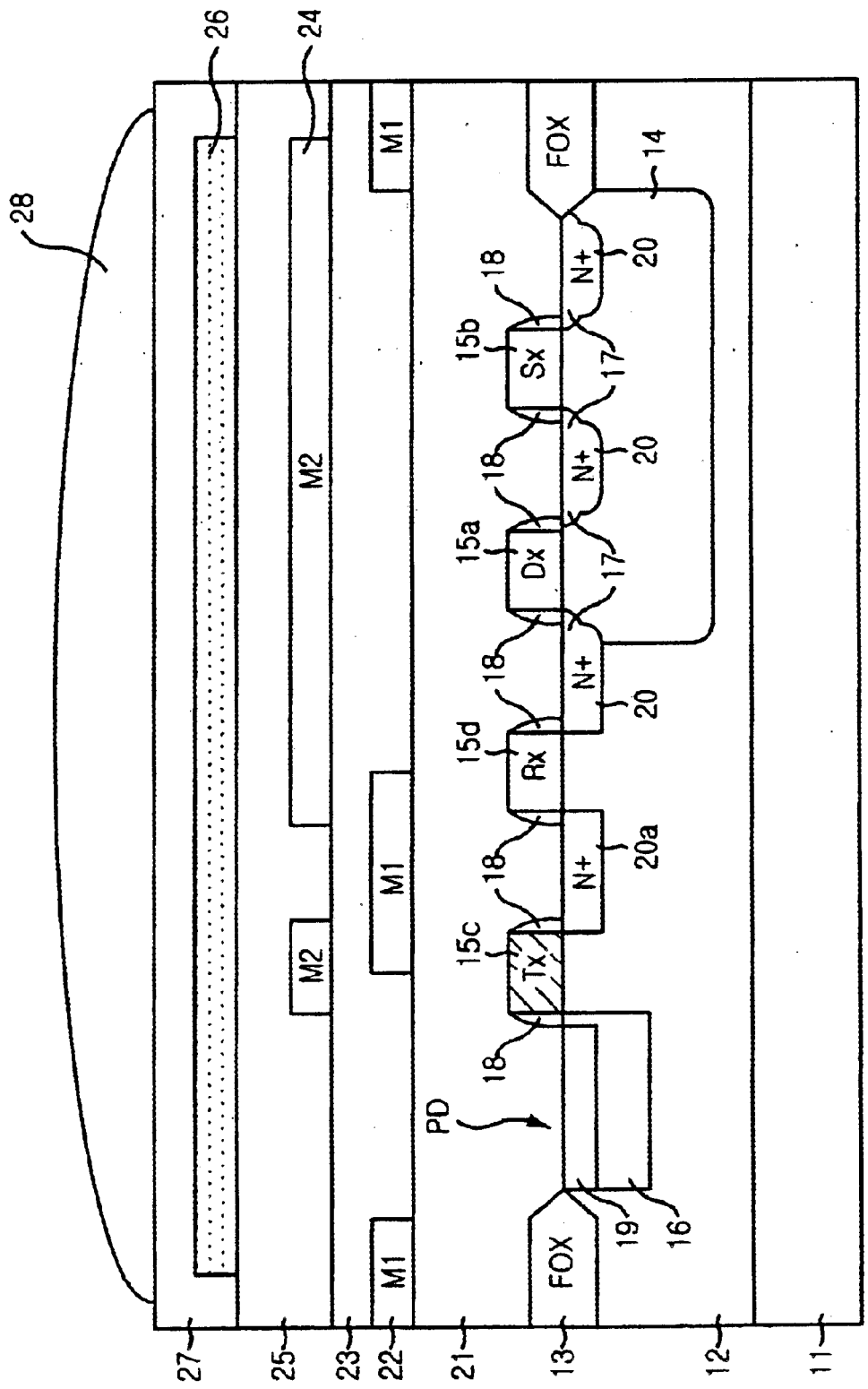
FIG. 2 is a cross-sectional view showing a conventional CMOS image sensor.
Figure 3:
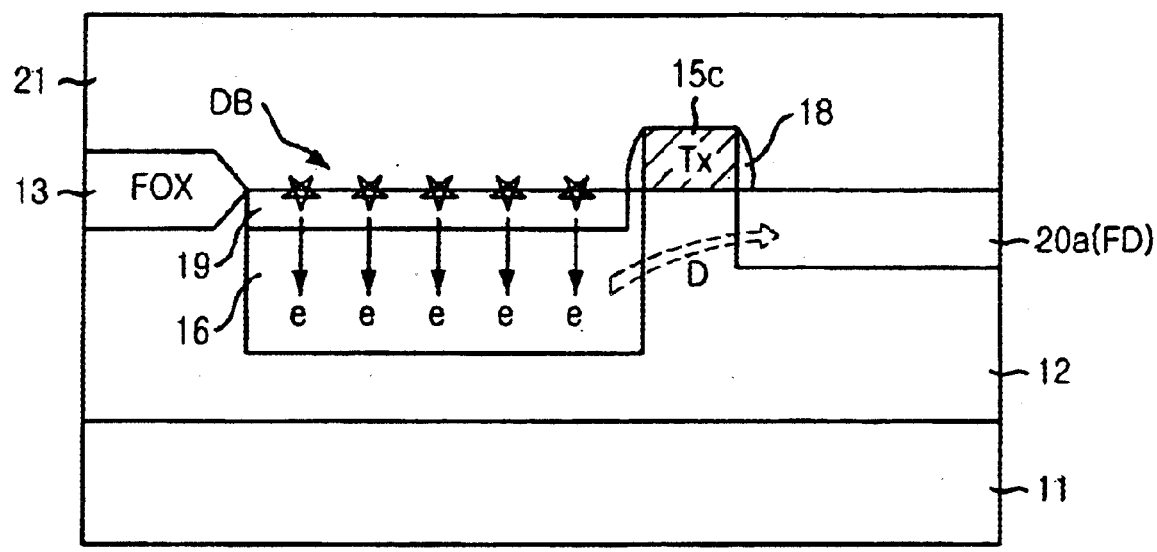
FIG. 3 is a cross-sectional view showing a generation of dark current generation in a convention image sensor.
Figure 4A:
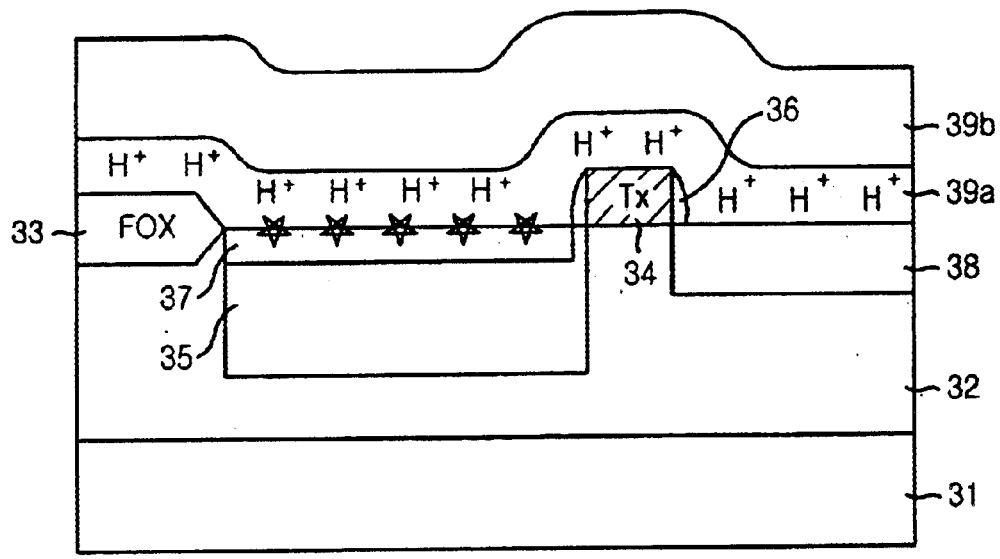
FIGS. 4A to 4C are cross-sectional views showing a method of manufacturing a CMOS image sensor in accordance with the disclosed method.
Figure 4B:
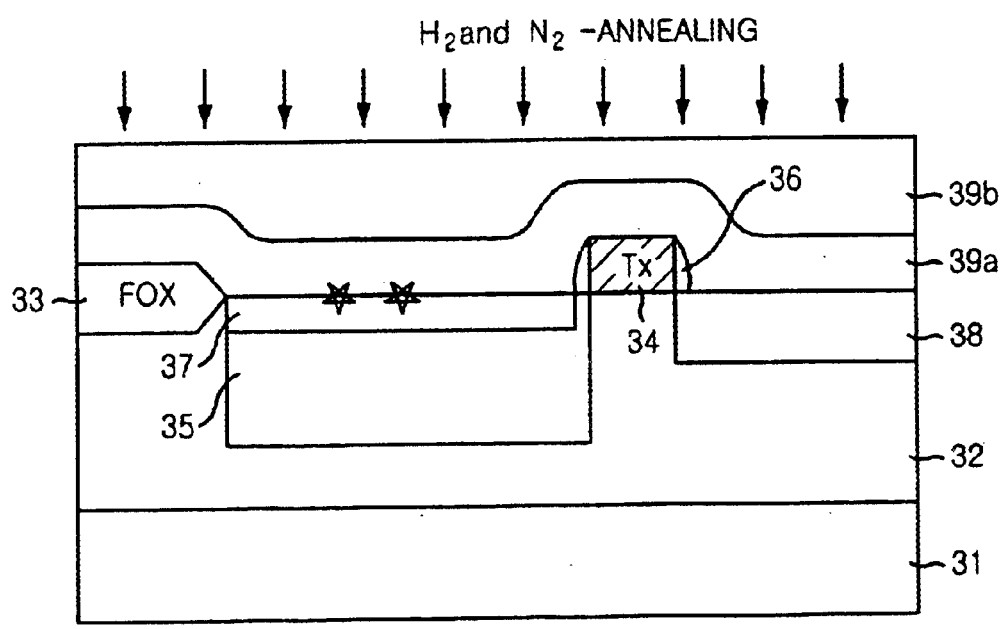
Figure 4C:
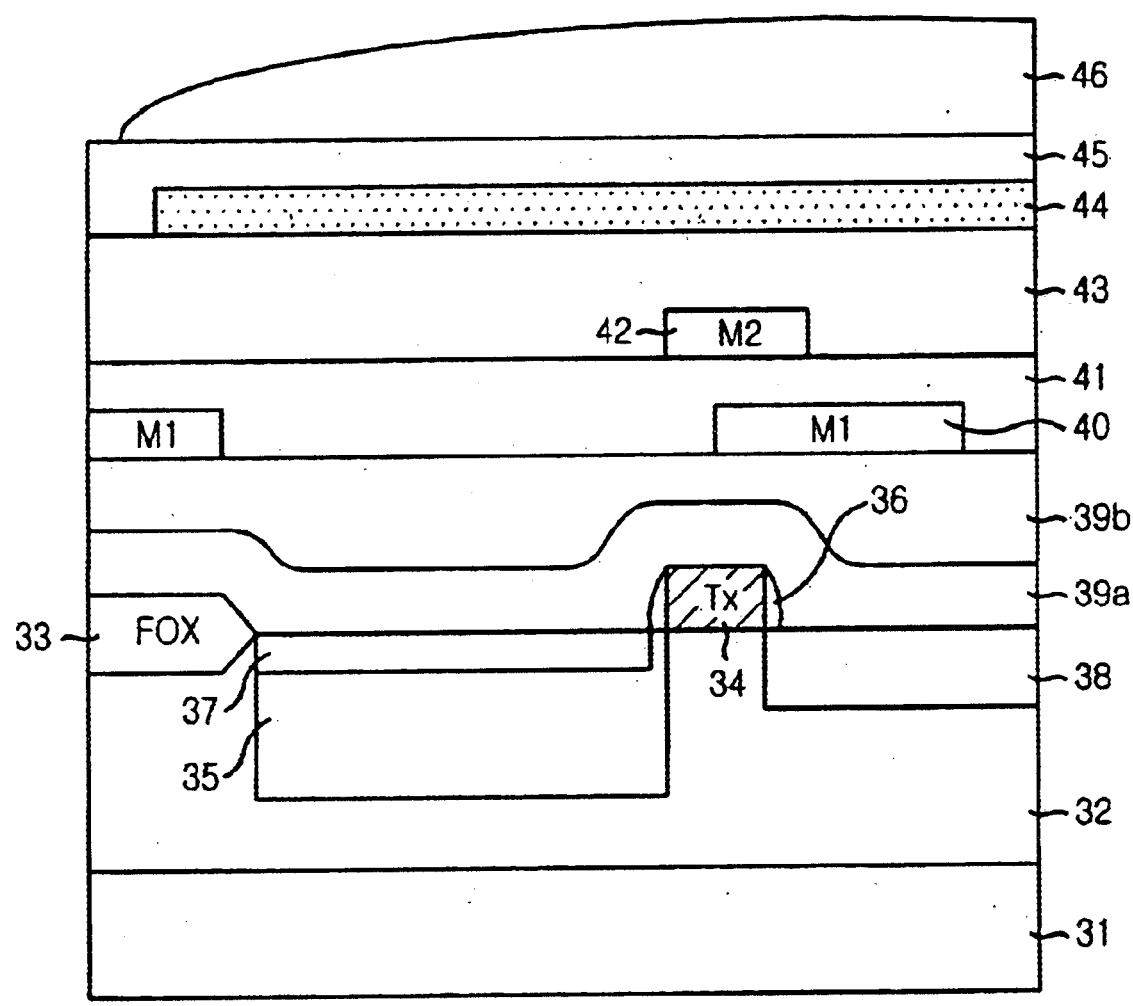

FIGS. 4A to 4C are cross-sectional views showing a method of manufacturing a complementary metal oxide semiconductor (CMOS) image sensor in accordance with the disclosed method. In these figures, a reset transistor, a drive transistor and a select transistor are omitted.

Referring to FIG. 4A, a p-epitaxial layer 32 is grown on a $p^+$-substrate 31. Herein, the $p^+$-substrate 31 is doped with a high concentration of p-type dopant and the p-epitaxial layer 32 is doped with a low concentration of p-type dopant. After growing the p-epitaxial layer 32, a field oxide layer 33 for separating unit pixels is formed in a predetermined region of the p-epitaxial layer 32 by using a local oxidation of silicon (LOCOS) method.

Thereafter, a p-well (not shown) is formed in a predetermined region of the p-epitaxial layer 32 with a lateral diffusion caused by a thermal treatment. On the p-well, gates of a drive transistor (Dx) and a select transistor (Sx) are to be formed.

Thereafter, gate electrodes (not shown) of the drive transistor (Dx) and the select transistor (Sx), are formed on the p-well, and gate electrode 34 of the transfer transistor (Tx) and the reset transistor (Rx) are formed on the p-epitaxial layer 32. At this time, the four gate electrodes are formed of a polycide comprising a polysilicon layer and a tungsten silicide layer.

Subsequently, a low concentration of n-type dopant $(n^-)$ is injected into the p-epitaxial layer 32 around one side of the gate electrode 34 of the transfer transistor (Tx) with high energy in order to form a $n^-$-diffusion layer 35.

Thereafter, an ion injection process is carried out to form lightly doped drains (LDD) (not shown) of the drive transistor (Dx) and the select transistor (Sx). Then, after depositing an insulating layer on the substrate 31, the insulating layer is etched without an etch mask to form a spacer 36 on each side of the four gate electrodes.

Then, p-type dopants (p°) are injected without an ion implantation mask, to form a p°-diffusion region 37 at the surface of the p-epitaxial layer 32. At this time, the p°-diffusion layer 37 contacted to the $n^-$-diffusion layer 35 is apart from the gate of the transfer transistor (Tx) as much as the width of the spacer 36.

A shallow PN connection composed of the p°-diffusion layer 37/the $n^-$-diffusion layer 35 and a PNP-type photodiode composed of the p-epitaxial layer 32/the $n^-$-diffusion layer 35/the p°-diffusion layer 36 are formed by the above-mentioned processes.

Subsequently, an ion injection process for forming a source/drain region is carried out. That is, a floating sensing node 38, which is common node of the reset transistor (Rx) and the transfer transistor (Tx), and source/drains (not shown) of the drive transistor (Dx), the selective transistor (Sx) and the reset transistor (Rx) are formed. The drive transistor (Dx) and the select transistor (Sx) are general MOS transistors, and the reset transistor (Rx) and the transfer transistor (Tx) are native NMOS transistors.

Subsequently, a pre-metal dielectric (PMD) layer is formed by depositing a siliconoxynitride ($SiO_xN_y$) layer 39a and a borophosphosilicate glass (BPSG) layer 39b in order, at this time, the $SiO_xN_y$ layer 39a contains lots of hydrogen ions, and is formed of a mixed gas of $SiH_4$ and $N_2O$ to a thickness of about 300 Å to about 2000 Å. A refractive index (RI) of a $SiO_xN_y$ layer is about 1.66, so there is no need to perform additional processes for removing the $SiO_xN_y$ layer. A reaction between the reaction gas $NH_3$ and the mixed source gases of $SiH_4$ and $N_2O$ for forming the $SiO_xN_y$ layer is denoted in Eq. 1:

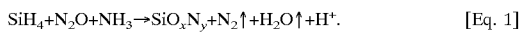

$$SiH_4 + N_2O + NH_3 \rightarrow SiO_xN_y + N_2\uparrow + H_2O\uparrow + H^+. \quad [Eq. 1]$$

With the reaction shown in Eq. 1, the $SiO_xN_y$ layer is formed, in addition, volatile $N_2$ gas and H elements are produced. One portion of the H elements reacts with O elements to form a $H_2O$ gas and another portion remains in the $SiO_xN_y$ layer as a $H^+$ ion state.

After forming the pre-metal dielectric (PMD) layer, dangling bonds DB are generated on a surface of the p°-diffusion layer 37 of a photodiode, as in conventional methods.

Referring to FIG. 4B, a flowing process is performed at a temperature of about 700° C. to about 900° C. in an ambient atmosphere of $H_2$ and $N_2$ in order to flatten the BPSG layer 39b. At this time, the hydrogen ions $H^+$ left in the $SiO_xN_y$ layer 39a are diffused toward the surface of the p°-diffusion layer 37 of the photodiode region. The temperature of the flowing is determined to operate over a temperature at which the hydrogen ions $H^+$ can be diffused, especially at a temperature of about 700° C. to about 900° C., the hydrogen ions $H^+$ can be actively diffused. Due to the diffusion of the hydrogen ions $H^4$, dangling bonds at the surface of the p°-diffusion layer 37 of the photodiode region can be removed, to suppress the generation of an excessive dark current. Flowing may also be performed at a temperature of about 700° C. to about 800° C. in an ambient atmosphere of $H_2$ and $N_2$.

Referring to FIG. 4C, a metal contact hole (not shown) and a first metal wiring (M1, 40) are formed on the flattened BPSG layer 39b, then an inter-metal-dielectric (IMD) layer 40 is formed on the first metal wiring 41.

Thereafter, a second metal wiring (M2, 42) is formed on the IMD layer 41, and a protection layer is formed on the substrate 31 including the second metal wiring 42 to complete a general process for forming a CMOS logic region.

Subsequently, three color filters 43 are formed to realize a color image, and an over coating layer 44 is formed for flattening a resulting structure formed on the substrate 31, then a microlens 45 is formed to increase light concentration.

According to the disclosed method, the amount of the dangling bonds generated at the boundary of the p°-diffusion layer 37 and the PMD layer 39, namely at the boundary of a silicon layer and an oxide layer, can be reduced, even though lots of dangling bonds DB are generated on the surface of the p°-diffusion layer 37 during a plurality of etching processes. That is, the amount of dangling bonds can be reduced by forming a part of the protection layer with the $SiO_xN_y$ layer 44 containing lots of hydrogen ions and by diffusing hydrogen ions into the surface of the p°-diffusion layer 37 to combine with the dangling bonds in the thermal treatment performed in the ambient atmosphere of hydrogen. In other words, a hydrogen ion is combined with a dangling bond, such as (—Si—O) or (—Si—), at the boundary of the silicon layer and the oxide layer. Therefore, it is possible to prevent a dark current from flowing to the floating sensing node 38, to the utmost.

Figure 5A:
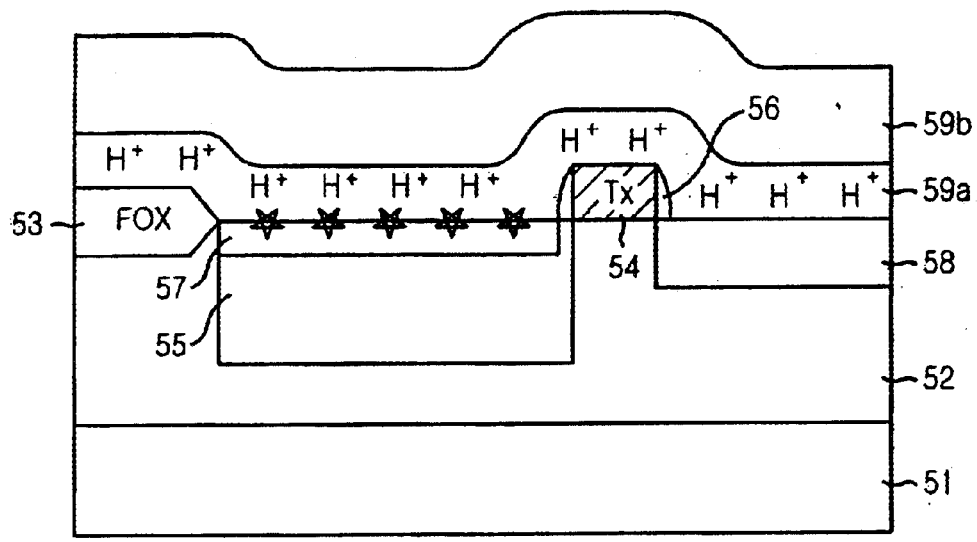
FIGS. 5A to 5C are cross-sectional views showing a method of manufacturing a CMOS image sensor in accordance with the disclosed method.
Figure 5B:
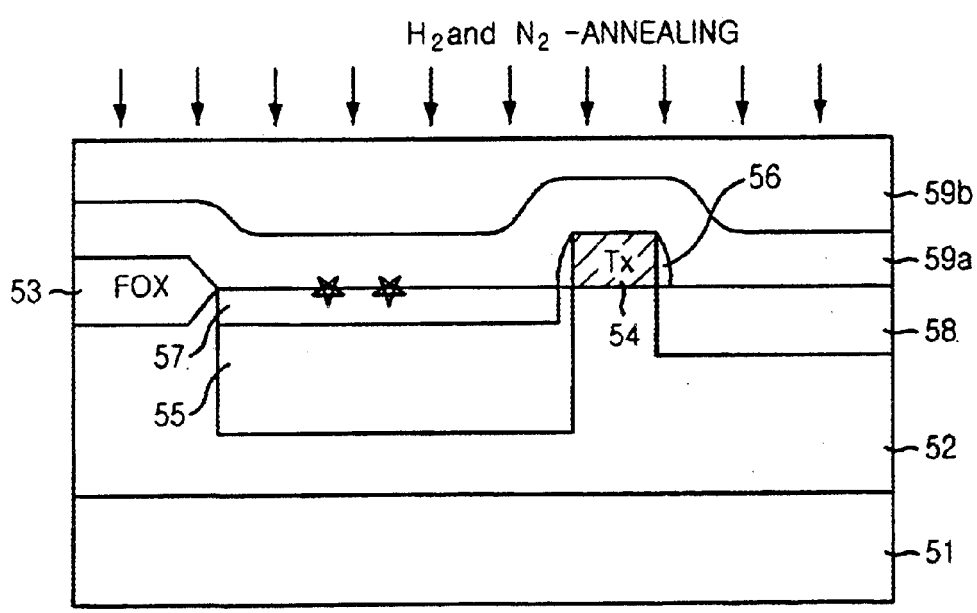
Figure 5C:
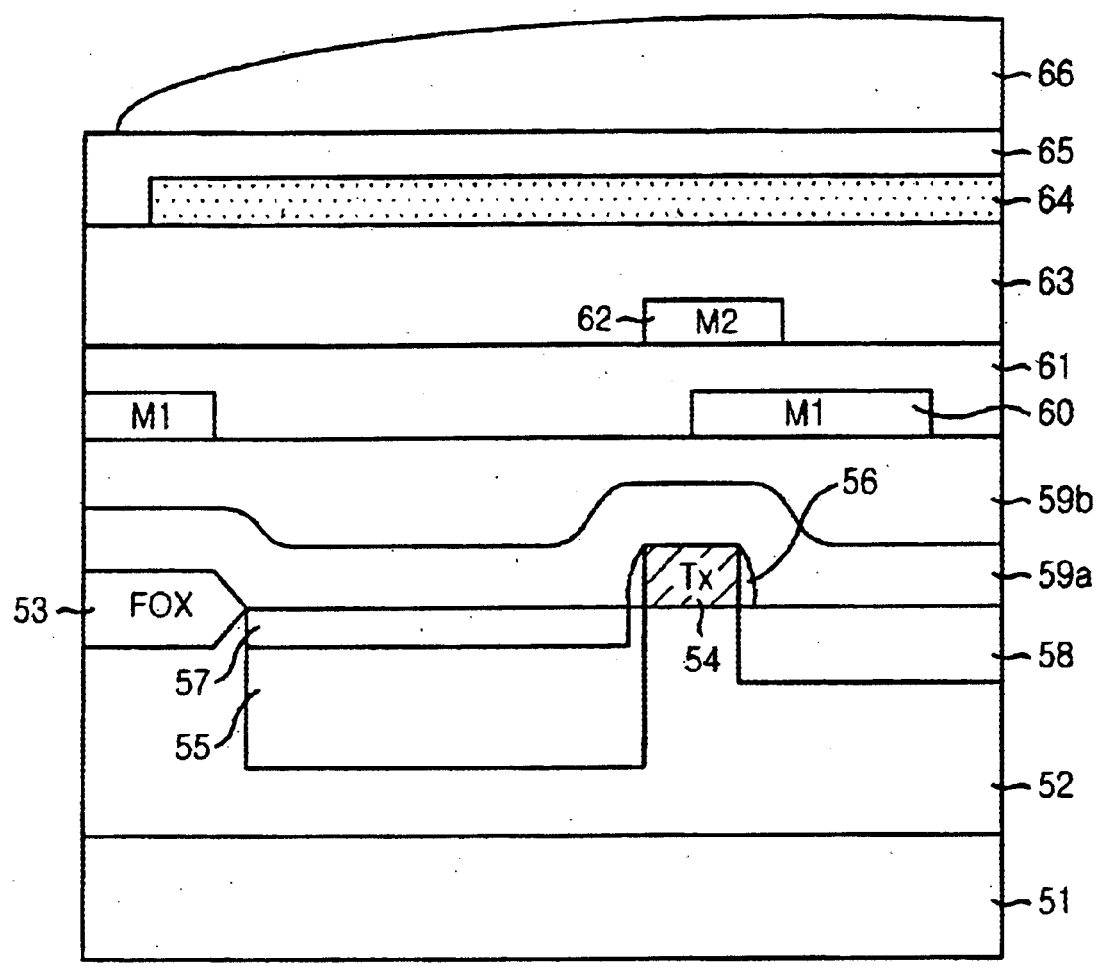

FIGS. 5A to 5C are cross-sectional views showing a method of manufacturing a complementary metal oxide semiconductor (CMOS) image sensor in accordance with the disclosed method. In these figures, a reset transistor, a drive transistor and a select transistor are omitted.

Referring to FIG. 5A, a p-epitaxial layer 52 is grown on a p$^+$-substrate 51. Herein, the p$^+$-substrate 51 is doped with a high concentration of p-type dopant and the p-epitaxial layer 52 is doped with a low concentration of p-type dopant. After growing the p-epitaxial layer 52, a field oxide layer 53 for separating unit pixels is formed in a predetermined region of the p-epitaxial layer 52 by using a local oxidation of silicon (LOCOS) method.

Thereafter, a p-well (not shown) is formed in a predetermined region of the p-epitaxial layer 52 with a lateral diffusion caused by a thermal treatment. On the p-well, gates of a drive transistor (Dx) and a select transistor (Sx) are to be formed.

Thereafter, gate electrodes (not shown) of the drive transistor (Dx) and the select transistor (Sx), are formed on the p-well, and a gate electrode 54 of the transfer transistor (Tx) and a gate of reset transistor (Rx) are formed on the p-epitaxial layer 52. At this time, the four gate electrodes are formed of a polycide comprising a polysilicon layer and a tungsten silicide layer.

Subsequently, a low concentration of n-type dopant (n$^-$) is injected into the p-epitaxial layer 52 around one side of the gate electrode 54 of the transfer transistor (Tx) with high energy in order to form a n$^-$-diffusion layer 55.

Thereafter, an ion injection process is carried out to form lightly doped drains (LDD) (not shown) of the drive transistor (Dx) and the select transistor (Sx). After depositing an insulating layer on the substrate 51, the insulating layer is etched without an etch mask to form a spacer 56 on each side of the four gate electrodes.

Then, p-type dopants (p°) are injected without an ion implantation mask, to form a p°-diffusion region 57 at the surface of the p-epitaxial layer 52. At this time, the p°-diffusion layer 57 contacted to the n$^-$-diffusion layer 55 is apart from the gate of the transfer transistor (Tx) as much as the width of the spacer 56.

A shallow PN connection composed of the p°-diffusion layer 57/the n$^-$-diffusion layer 55 and a PNP-type photodiode composed of the p-epitaxial layer 52/the n$^-$-diffusion layer 55/the p°-diffusion layer 57 are formed by the above-mentioned processes.

Subsequently, an ion injection process for forming a source/drain region is carried out. That is, a floating sensing node 58, which is common node of the reset transistor (Rx) and the transfer transistor (Tx), and source/drains (not shown) of the drive transistor (Dx), the selective transistor (Sx) and the reset transistor (Rx) are formed. The drive transistor (Dx) and the select transistor are general MOS transistors, and the select transistor (Sx) and the transfer transistor (Tx) are native NMOS transistors.

Subsequently, a pre-metal dielectric (PMD) layer is formed by depositing a silicon nitride ($Si_3N_4$) layer 59a and a borophosphosilicate glass (BPSG) 59b in order, at this time, the $Si_3N_4$ layer 59a, which contains lots of hydrogen ions, is formed of a SiH4 gas to a thickness of about 300 Å to about 2000 Å. A reaction between the reaction gas $NH_3$ and the mixed source gases of $SiH_4$ and $N_2O$ for forming the $Si_xN_y$ layer is denoted in Eq. 2:

$$3SiH_4 + 4NH_3 \rightarrow Si_3N_4 + H_2\uparrow + H^+.$$ [Eq. 2]

With the reaction shown in Eq. 2, the $Si_3N_4$ layer is formed, in addition, H elements are produced. One portion of the H elements forms $H_2$ gas which can be pumped out and another portion remains in the $Si_3N_4$ layer as a $H^+$ ion state.

After forming the pre-metal dielectric (PMD) layer, dangling bonds DB are also generated on a surface of the p°-diffusion layer 57 of a photodiode, as in conventional methods.

Referring to FIG. 5B, a flowing process is performed at a temperature of about 700° C. to about 900° C. in an ambient atmosphere of $H_2$ and $N_2$ in order to flatten the BPSG layer 59b. At this time, the hydrogen ions $H^+$ left in the $Si_3N_4$ layer 59a are diffused toward the surface of the p°-diffusion layer 57 of the photodiode region. The temperature of the flowing is determined to over a temperature at which the hydrogen ions $H^+$ can be diffused, especially at a temperature of about 700° C. to about 900° C., the hydrogen ions $H^+$ can be actively diffused. Therefore, it is possible to diffuse the hydrogen ions $H^+$ and to flatten the BPSG layer 59b, simultaneously by one thermal treatment. Flowing may also be performed at a temperature of about 700° C. to about 800° C. in an ambient atmosphere of $H_2$ and $N_2$.

Due to the diffusion of the hydrogen ions $H^+$, dangling bonds at the surface of the p°-diffusion layer 57 of the photodiode region can be removed to suppress the generation of an excessive dark current.

Referring to FIG. 5C, a metal contact hole (not shown) and a first metal wiring (M1, 60) are formed on the flattened BPSG layer 59b, then an inter-metal-dielectric (IMD) layer 60 is formed on the first metal wiring 61.

Thereafter, a second metal wiring (M2, 62) is formed on the IMD layer 61, and a protection layer is formed on the substrate 51 including the second metal wiring 62 to complete a general process for forming a CMOS logic region.

Subsequently, three color filters 63 are formed to realize a color image, and an over coating layer 64 is formed for flattening a resulting structure formed on the substrate 51, then a microlens 65 is formed to increase light concentration.

According to the disclosed method, the amount of the dangling bonds generated at the boundary of the p°-diffusion layer 57 and the PMD layer 59, namely at the boundary of a silicon containing layer and an oxide layer, can be reduced, even though lots of dangling bonds DB are generated on the surface of the p°-diffusion layer 57 during a plurality of etching processes. That is, the amount of dangling bonds can be reduced by forming the PMD layer with a bi-layered structure comprising a $Si_3N_4$ layer containing lots of hydrogen ions and a BPSG layer, and by diffusion the hydrogen ions into the surface of the p°-diffusion layer 57 to combine with the dangling bonds during the thermal treatment performed in the ambient atmosphere of $H_2N_2$ for flattening the BPSG layer.

In other words, a hydrogen ion is combined with a dangling bond, such as (—Si—O) or (—Si—), at the boundary of the silicon layer and the oxide layer. Therefore, it is possible to prevent a dark current from flowing to the floating sensing node 58, to the utmost.

In the disclosed method, the thickness and the refractive index of the silicon nitride layers are higher than the thickness and the refractive index of the siliconoxynitride layers.

The generation of dark current can be prevented by the disclosed method, so a picture quality of an image sensor may be increased, and a yield decrease caused by a dark current can be prevented, too. Therefore, by practicing the disclosed method, it is possible to increase the efficiency/yield of image sensors. Moreover, the disclosed method can contribute to experiments for developing a dead zone characteristic, which has a trade-off with the dark current generation, and, therefore, it is possible to increase the performance of an image sensor in a low illumination condition.

The disclosed method can be used to decrease the generation of a dark current in various image sensors, such as a charge coupled device (CCD) and an active pixel sensor.

Although the preferred embodiments of the disclosed method have been described for illustrative purposes, those skilled in the art will appreciate that various modifications, additions and substitutions are possible, without departing from the scope and spirit of the method as disclosed in the accompanying claims.

For example, in the disclosed method, the siliconoxynitride layer and the silicon nitride layer containing hydrogen ions are adopted to form the PMD layer, however the siliconoxynitride layer or the silicon nitride layer containing hydrogen ions can be adopted to form any interlayer insulating layer which is formed under the protection layer, in order to provide an effect of removing the dangling bonds.

What is claimed is:

1. A method of manufacturing an image sensor, comprising the steps of:
   forming a photodiode in a semiconductor substrate;
   forming a transfer transistor, a reset transistor, a drive transistor, and a select transistor on the semiconductor substrate;
   forming a first interlayer insulating layer on the semiconductor substrate, wherein the first insulating layer contains hydrogen ions;
   forming a second interlayer insulating layer on the first interlayer insulating layer; and
   flattening the second interlayer insulating layer by annealing in an ambient atmosphere of $H_2$ and $N_2$, whereby the first insulating layer contains the hydrogen ions, and simultaneously diffusing the hydrogen ions into a surface of the photodiode.

2. The method of claim 1, comprising flowing by performing said annealing step at a temperature of about 700° C. to about 900° C.

3. The method of claim 1, comprising forming the first interlayer insulating layer from a source gas comprising $SiH_4$.

4. The method of claim 1, wherein the source gas further comprises $N_2O$ and $NH_3$.

5. The method of claim 3, comprising forming the first interlayer insulating layer to a thickness of about 300 Å to about 2000 Å.

6. The method of claim 1, wherein the first interlayer insulating layer comprises a layer selected from the group consisting of siliconoxynitride.

7. A method of manufacturing an image sensor, comprising the steps of:
   forming a photodiode in a semiconductor substrate;
   forming a transfer transistor, a reset transistor, a drive transistor, and a select transistor on the semiconductor substrate;

forming a siliconoxynitride layer on the semiconductor substrate, wherein the siliconoxynitride layer contains hydrogen ions;

forming a borophosphorilicate glass (BPSG) layer on the siliconoxynitride layer; and flattening the BPSG layer by annealing in an ambient atmosphere of $H_2$, and $N_2$, whereby the first insulating layer contains the hydrogen ions, and simultaneously diffusing the hydrogen ions into a surface of the photodiode.

8. The method of claim 7, comprising flowing by performing said annealing step at a temperature of about 700° C. to about 900° C.

9. The method of claim 7, comprising the siliconoxynitride layer from SiH4, N2O, and NH3.

10. The method of claim 7, comprising forming the siliconoxynitride layer to a thickness of about 300 Å to about 2000 Å.

11. A method of manufacturing an image sensor, comprising the steps of:

forming a photodiode in a semiconductor substrate;

forming a transfer transistor, a reset transistor, a drive transistor, and a select transistor on the semiconductor substrate;

forming a silicon nitride layer on the semiconductor substrate, wherein the silicon nitride layer contains hydrogen ions;

forming a borophosphorilicate glass (BPSG) layer on the siliconoxynitride layer; and flattening the BPSG layer by annealing in an ambient atmosphere of $H_2$, and $N_2$, whereby the first insulating layer contains the hydrogen ions, and simultaneously diffusing the hydrogen ions into a surface of the photodiode.

12. The method of claim 11, comprising flowing by performing said annealing step at a temperature of about 700° C. to about 900° C.

13. The method of claim 7, comprising the siliconoxynitride layer from $SiH_4$, $N_2O$, and $NH_3$.

14. A method of forming an interlayer insulating layer between wirings of an image sensor, comprising the steps of:

forming a first interlayer insulating layer in the semiconductor substrate having a photodiode therein, wherein the first interlayer insulating layer contains hydrogen ions;

forming a second interlayer insulating layer on the first interlayer insulating layer on the first interlayer insulating layer; and flattening the second interlayer insulating layer by annealing in an ambient atmosphere of $H_2$ and $N_2$, whereby the first insulating layer contains the hydrogen ions, and diffusing the hydrogen ions into a surface of the photodiode.

15. The method of claim 14, wherein said annealing step is carried out at a temperature of about 700° C. to about 900° C.

16. The method of claim 14, wherein the first interlayer insulating layer comprises a layer selected from the group consisting of siliconoxynitride layers and silicon nitride layers.

* * * * *